(12) United States Patent
Hurkx et al.

(10) Patent No.: US 6,624,472 B2
(45) Date of Patent: Sep. 23, 2003

(54) SEMICONDUCTOR DEVICE WITH VOLTAGE SUSTAINING ZONE

(75) Inventors: Godefridus A. M. Hurkx, Best (NL); Rob Van Dalen, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/781,382

(22) Filed: Feb. 12, 2001

(65) Prior Publication Data

US 2001/0048131 A1 Dec. 6, 2001

(30) Foreign Application Priority Data

Feb. 12, 2000 (GB) .............................................. 0003186

(51) Int. Cl.[7] .............................................. H01L 29/78
(52) U.S. Cl. ...................... 257/339; 257/345; 257/489
(58) Field of Search ................................. 257/489, 339, 257/345

(56) References Cited

U.S. PATENT DOCUMENTS

| | | | |
|---|---|---|---|
| 4,754,310 A | 6/1988 | Coe | 357/13 |
| 5,164,804 A | 11/1992 | Terashima | 257/487 |
| 6,201,279 B1 * | 3/2001 | Pfirsch | 257/333 |

FOREIGN PATENT DOCUMENTS

| | | |
|---|---|---|
| GB | 2089118 A | 6/1982 |
| WO | 0068998 A1 | 11/2000 |

OTHER PUBLICATIONS

"Characteristics of Shallow Boron–Doped Layers in Si by Rapid Vapor–Phase Direct Doping", by Y. Kiyota et al., J. Electrochem Soc. vol. 140, No. 4, Apr. 1993.

* cited by examiner

*Primary Examiner*—Jerome Jackson
(74) *Attorney, Agent, or Firm*—Steven R. Biren

(57) ABSTRACT

A semiconductor body has first and second opposed major surfaces. A first region meets the first major surface and at least one second region meets the second major surface. The semiconductor body provides a voltage-sustaining zone between the first and second regions. The voltage sustaining zone has third regions of one conductivity type interposed with fourth regions of the opposite conductivity type with the second and third regions providing a rectifying junction such that, in use, when the rectifying junction is forward biased in one mode of operation by a voltage applied between the first and second regions, a main current path is provided between the first and second major surfaces through the first region, the voltage-sustaining zone and the second region.

15 Claims, 4 Drawing Sheets

SEMICONDUCTOR DEVICE WITH VOLTAGE SUSTAINING ZONE

BACKGROUND OF THE INVENTION

This invention relates to a semiconductor device with a voltage-sustaining zone.

It is well known in the semiconductor art that the spread of the depletion region of a reverse-biased rectifying junction (and so breakdown voltage of that junction) can be increased by reducing the dopant concentration and increasing the size of a semiconductor region associated with the rectifying junction. However, although this enables the reverse breakdown voltage to be increased, it also increases the resistivity and length of the current path through the device when the rectifying junction is forward biased in the ON condition of the device. This means that the series resistivity of the current path for majority charge carriers through the device increases in proportion to approximately the square of the desired reverse breakdown voltage, so limiting the current handling capability of the device for a given maximum thermal dissipation.

U.S. Pat. No. 4,754,310 (our reference PHB32740) addresses this problem by providing one of the regions forming the rectifying junction as a zone formed of first regions of one conductivity type interposed with second regions of the opposite conductivity type with the dopant concentrations and dimensions of the first and second regions being such that, when the rectifying junction is reversed biased in operation and the zone is depleted of free charge carriers, the space charge per unit area in the first and second regions balances at least to the extent that the electric field resulting from the space charge is less than the critical field strength at which avalanche breakdown would occur. This enables the required reverse breakdown voltage characteristics to be obtained using interposed semiconductor regions which individually have a higher dopant concentration, and thus lower resistivity, than would otherwise be required so that the series resistivity of the first and second regions and thus the on-resistance of a device such as a MOSFET can be lower than for conventional devices.

SUMMARY OF THE INVENTION

It is an aim of the present invention to provide another way of improving the trade off between breakdown voltage and on-resistance in vertical high voltage semiconductor devices where the word "vertical" should be understood to mean that the main current flow path through the device is between first and second main opposed surfaces of the device.

According to one aspect of the present invention there is provided a vertical semiconductor device wherein a voltage sustaining zone adjoining a rectifying junction has regions of one conductivity type interposed with regions of the opposite conductivity type with the dimensions and dopant concentrations of the interposed regions being such that, when the interposed regions are depleted of free charge carriers, the space charge per unit area of the third and fourth regions substantially balance, a plurality of field shaping regions being dispersed within the voltage sustaining zone, each field shaping region providing a resistive path extending from the rectifying junction through the voltage sustaining zone so that when the rectifying junction is reverse-biased in operation a leakage current flows along the resistive paths to modify the electric field gradient within the voltage-sustaining zone.

According to an aspect of the present invention, there is provided a semiconductor device as set out in claim 1.

The present invention thus provides a semiconductor device wherein the resistive paths enable a linear potential gradient to be achieved within a voltage sustaining zone so that any imbalance between the interposed regions forming the voltage sustaining zone is compensated for so relaxing the tolerances on formation of the interposed regions of the voltage sustaining zones.

Other advantageous technical features in accordance with the present invention are set out in the appended dependent claims.

BRIEF DESCRIPTION OF THE DRAWING

Embodiments of the present invention will now be described, by way of example, with reference to the accompanying diagrammatic drawings, in which.

It should be noted that the Figures are diagrammatic, relative dimensions and proportions of parts having been shown exaggerated or reduced in size for the sake of clarity and convenience. The same reference signs are generally used to refer to corresponding or similar features in the different embodiments.

DESCRIPTION OF THE PREFERRED EMBODIMENTS

Figure 1:
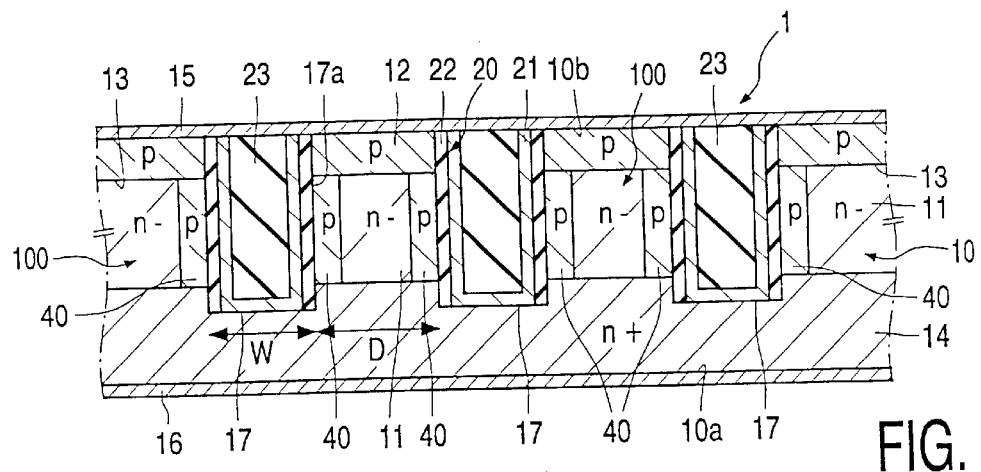
FIG. 1 shows a diagrammatic cross-sectional view through part of a first embodiment of a semiconductor device in accordance with the present invention.

Referring now to FIG. 1, this shows part of a semiconductor device 1 in the form of a pn-n rectifier or diode. The semiconductor device 1 comprises a monocrystalline silicon semiconductor body 10 having first and second opposed major surfaces 10a and 10b. The semiconductor body 10 comprises a first region 14 which is relatively highly doped with impurities of one conductivity type (n+ conductivity type in this example) adjoining the first major surface 10a so as to form an ohmic contact with a first metallisation layer 60 forming one electrode of the diode. A second metallisation layer or electrode 15 provided on the second major surface 10b of the semiconductor body forms an ohmic contact with a second region 12 of the opposite conductivity type (p conductivity type in this example). Typically the first and second semiconductor regions will have dopant concentrations of $10^{19}$ atoms $cm^{-3}$.

The first and second regions 14 and 12 are separated by a voltage sustaining zone 100 which provides the lowly doped region of the pn-n diode and enables the diode to sustain a high reverse biasing voltage across the first and second electrodes 16 and 15.

The pn-n diode shown in FIG. 1 differs from a conventional pn-n diode in the manner in which the voltage sustaining zone 100 is formed. As shown in FIG. 1, the voltage sustaining zone 100 comprises interposed opposite conductivity type regions 11 and 40 having dopant concentrations and thicknesses such that, when a reverse biasing voltage is applied across the first and second electrodes 16 and 15 and the interposed semiconductor regions 11 and 40 are depleted of free charge carriers, the space charge per unit area formed in the opposite conductivity type interposed regions 11 and 40 balances at least to the extent that the electric field resulting from any imbalance is less than the critical field strength at which avalanche breakdown would occur in the voltage sustaining zone 100. In addition to the interposed regions 11 and 40, the voltage sustaining zone 100 comprises a mesh or grid-like field shaping or field relief region 20 extending throughout the voltage sustaining zone 100 so as to provide resistive paths extending in a direction between the first and second major surfaces 10a and 10b and at least partly through the voltage sustaining zone 100. In the arrangement shown in FIG. 1, the field relief region 20 extends completely through the voltage sustaining zone 100.

In the embodiment shown in FIG. 1, each field shaping region comprises a layer 21 of semi-insulating or highly resistive material deposited in a corresponding opening 17 extending into the semiconductor body 10 from the first major surface 10a just to or as shown into the region 14. The upper and lower limits for the resistivity will depend on the device characteristics with the lower limit being determined by the maximum acceptable leakage current and the upper limit being determined by the required switching and ruggedness characteristics. The resistive or semi-insulating layer 21 may be, for example, a layer of polycrystalline silicon doped with oxygen and/or nitrogen so as to have a resistivity of from about $10^7$ to about $10^9$ ohm cm or may be a layer of silicon nitride having a similar resistivity. The semi-insulating layer 21 is separated from side walls 17a of the opening 17 by respective layers 22 of an insulating material, typically silicon dioxide. Typically, the semi-insulating layers 21 will have a thickness of 0.5 $\mu$m (micrometers) while the insulating layer 22 will have a thickness of, for example, 30 nm (nanometers). To provide a planar first major surface 10a for the metallisation 15, the openings 17 are filled with a filler material 23 such as TEOS (Tetraethylorthosilicate).

Typically, the first region 11 will have a thickness of from 3 to 30 $\mu$m and, when viewed in plan looking down on the major surface 10b, the opening 17 will be in the form of a continuous trench having a regular grid or mesh-like structure bounding areas which are each square, hexagonal or circular and arranged in a regular matrix or array. As another possibility a stripe-like geometry may be adopted. In an embodiment, the areas bounded by the opening 17 may be square when viewed looking down on the first major surface 10a and may be arranged in a square matrix so that the width D of the areas bounded by the opening 17 is the same as the width W of the opening 17 and is, for example, 5 or 10 micrometers with there being, typically, many thousands of such areas in a device. With this geometry, the opening 17 forms, when viewed in plan looking down on the surface 10b, a continuous mesh or grid. The geometrical structure may be inverted so that the regions 12 and 11 form a mesh or grid and a plurality of field shaping regions 20 are provided.

In operation of the diode shown in FIG. 1, when a reverse biasing voltage is applied across the electrodes 16 and 15, the thickness and doping concentration of the interposed regions 11 and 40 is such that, when depleted of free charge carriers, the space charge per unit area of the interposed regions 11 and 40 balances at least to the extent that an electric field resulting from any imbalance is less than the critical field strength at which avalanche breakdown would occur in the voltage sustaining zone. The resistive paths 21 provided by the field relief regions 20 provide a current leakage path which results in a linear potential gradient along the resistive paths 21 so as to compensate for any imbalance in the space charge per unit area of the interposed regions so as to render more uniform the electric field distribution in the voltage sustaining zone 100. Thus, in the diode shown in FIG. 1 the major part of the voltage sustaining action is provided by the interposed regions 11 and 40 while the field relief regions or resistive paths serve to compensate for any imbalance between the interposed regions. By virtue of the interposed regions 11 and 40 the diode 1 responds rapidly under transient conditions while the resistive paths 21 render the device insensitive to dopant variations and interface charges so enabling the manufacturing tolerances on formation of the interposed regions 11 and 40 to be relaxed somewhat.

The dopant concentration and thicknesses of the interposed regions 11 and 40 should be such that $[n-]xW_{n-}=2 \times 10^{12}$ atoms $cm^{-2}$ while $[p-]xW_{p-}=10^{12}$ atoms $cm^{-2}$ where $[n-]$ and $[p-]$ are the dopant concentrations for the regions 11 and 40, respectively, and $W_{n-}$ and $W_{p-}$ are the widths of the regions 11 and 40, respectively.

Figure 2:
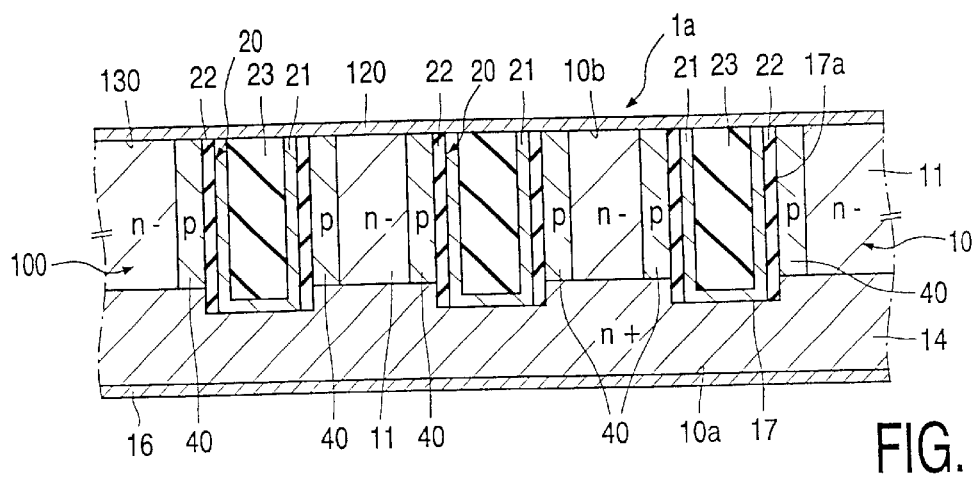
FIG. 2 shows a diagrammatic cross-sectional view similar to FIG. 1 through part of a second embodiment of a semiconductor device in accordance with the present invention.

FIG. 2 shows another example of a semiconductor diode 1a in accordance with present invention. The semiconductor diode 1a shown in FIG. 2 differs from that shown in FIG. 1 in that the second region 12 is not a semiconductor region but is a Schottky metal region 120 which forms a Schottky junction 130 with the first region. The Schottky metal region 120 also forms at least part of the electrode 15. The region 120 may be formed of, for example, a silicide such as platinum silicide.

Figure 3:
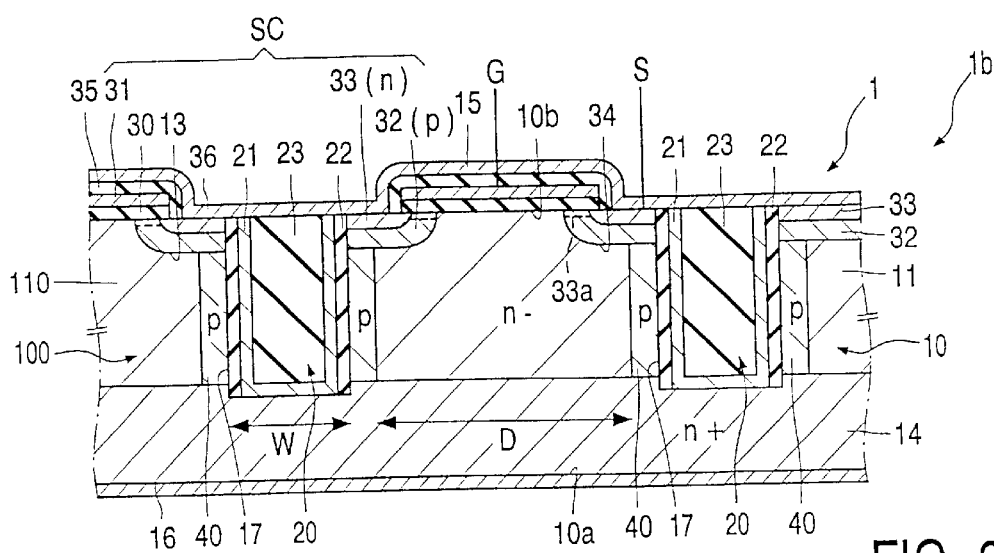
FIG. 3 shows a diagrammatic cross-sectional view similar to FIG. 1 through part of a third embodiment of a semiconductor device in accordance with the invention.
Figure 4:
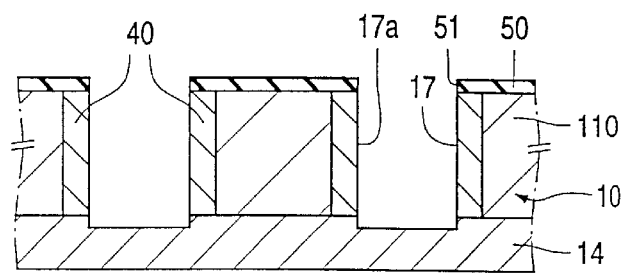
FIGS. 4 to 7 illustrate steps in one example of a method that may be used in manufacturing the semi-conductor device shown in FIG. 1 or FIG. 2.

FIG. 3 shows a cross sectional view similar to FIGS. 1 and 2 of another example of a semiconductor device in accordance with the present invention.

The semiconductor device 1b shown in FIG. 3 is a vertical power MOSFET. The MOSFET has a semiconductor body 10 comprising a relatively highly doped first region or substrate 14 of the one conductivity type (n+ conductivity type in this example) on which is formed a relatively lowly doped epitaxial layer 110 of the same conductivity type (n- conductivity type in this example) so that a free surface of the substrate 14 forms a first major surface 10a of the semiconductor body while a free surface of the epitaxial layer 110 forms a second major surface 10b of the semiconductor body opposed to the first major surface 10a. The semiconductor body 10 carries a plurality of source cells SC each of which consists of a body region 32 of the opposite conductivity type (p conductivity type in this example) containing a source region 33 of the one conductivity type (n conductivity type in this example) so that the body region 32 and source region 33 define therebetween a conduction channel region 33a. (Only one full source cell is shown although typically there will be hundreds or thousands of cells).

An insulated gate structure G comprising a gate dielectric layer 30 and a gate conductive layer 31 is provided on the second major surface so as to overlie the conduction channel areas 33a of the source cells SC to control a conduction channel through the conduction channel areas 33a so as to control the flow of majority charge carriers from the source regions 33 through the epitaxial layer 110 (which forms a drain drift region) to the drain region 14. The source cells SC are connected in parallel to a source electrode S provided by source metallisation 15 deposited on the second major surface 10b.

The insulated gate structure G is isolated from the source electrode S by dielectric regions 35. Although not shown in FIG. 3, a gate electrode contacting the insulated gate structure G is provided by means of a window formed in a dielectric region 35 and appropriate patterning of the metallisation 15 deposited to form the source electrode S so as to provide a separate gate electrode contacting the gate conductive layer 31 through the window in the dielectric region 35.

The structure of the vertical MOSFET 1b described so far is that of a conventional vertical DMOSFET.

The MOSFET 1b shown in FIG. 3 differs from a conventional DMOSFET by virtue of the structure of the drain drift region 110 which, as is well known to the person skilled in the art, needs to be designed as a voltage sustaining zone to enable the vertical MOSFET to withstand high reverse biasing voltages across the pn junction between the body regions 32 and the drain drift region 110 when the MOSFET is non-conducting. In the MOSFET 1b shown in FIG. 3, the voltage sustaining region 110 is formed by interposed n and p conductivity type regions 11 and 40 whose dopant concentration and thickness is chosen so that, when these regions are depleted of free charge carriers, the space charge per unit area formed in these regions balances at least to the extent that the electric field resulting from any imbalance is less than a critical field strength at which avalanche breakdown would occur.

In addition, field relief regions 20 are dispersed within the voltage sustaining zone 110 to provide resistive paths extending in the direction in which the major current flow path through the MOSFET 1b would occur in the conducting state, that is substantially perpendicular to the first and second opposed major surfaces 10a and 10b. The field relief regions 20 shown in FIG. 3 have the same structure as that described above with reference to FIG. 1 where the inverted geometry is used (that is where discrete field relief regions 20 are provided). Each field relief region 20 is associated with a corresponding source cell SC so that the field relief region 20 extends centrally of and through the corresponding source cell SC.

The field relief regions 20 act in the manner described above with reference to FIGS. 1 and 2 so as to provide a leakage current path generating a linear potential gradient in the voltage sustaining region 110 in the direction between the first and second major surfaces so as to compensate for any imbalance in the doping of the interposed regions 11 and 40.

FIGS. 4 to 7 illustrate cross-sectional views of part of a semiconductor body to illustrate steps in one example of a method of manufacturing a semiconductor diode 1 as shown in FIG. 1 or semiconductor diode 1a as shown in FIG. 2.

Initially a semiconductor body 10 is provided consisting of a n+ conductivity type substrate for forming the region 14. The n− conductivity type epitaxial layer 110 is grown on the substrate 14. A masking layer 50 is provided on the surface of the epitaxial layer 110 and patterned using conventional photolithographic techniques to define windows 51 in the masking layer 50. An anisotropic etching process is then carried out as is known in the art to define the openings 17 extending through the epitaxial layer 110 into the substrate 14 to produce the structure shown in FIG. 4. Impurities for forming the p conductivity type regions 40 are then introduced using the masking layer 50 as a mask. As will be understood by those skilled in the art, the concentration of impurities introduced is sufficient to overdope the relatively lowly doped epitaxial layer 110 but not sufficient to overdope the highly doped substrate 14 to any significant extent. The impurities for forming the p conductivity type regions 40 may be introduced using a conventional rapid vapour deposition technique as disclosed in, for example, a paper by Y. Kiyota et al in the Journal of the Electrochemical Society, Vol. 140, No. 4, 1993.

Figure 5:
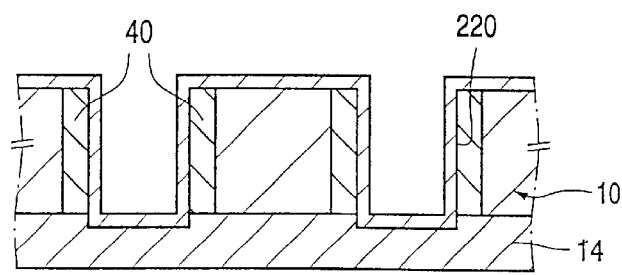
Figure 6:
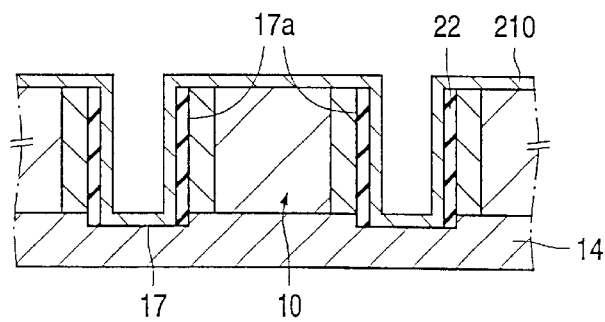
Figure 7:
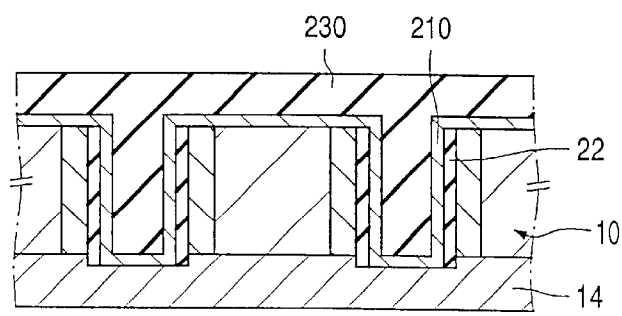
Figure 8:
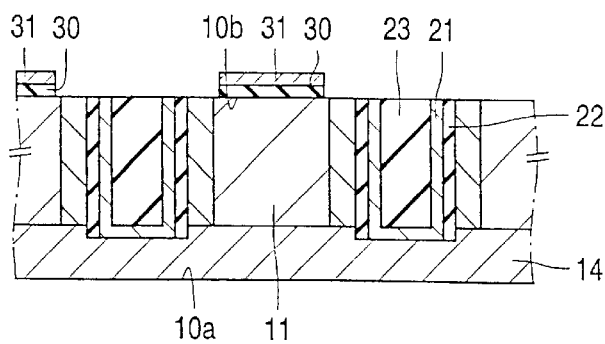
FIG. 8 illustrates an step additional to those shown in FIGS. 4 to 7 that may be involved in manufacturing the semiconductor device shown in FIG. 3.

The masking layer 50 is then removed using conventional masking layer removal techniques and, after cleaning of the exposed surface, a thermal oxide layer 220 is grown on the exposed silicon surface as shown in FIG. 5. The thermal oxide layer 220 is then subjected to an anisotropic etching process to leave the oxide only on the side walls 17a of the opening(s) 17 so as to form the insulating layers 22. A layer 210 of semi-insulating or resistive material, in this case oxygen doped polycrystalline silicon or semi-insulating silicon nitride (SiN), is then deposited using known chemical vapour deposition techniques. A filler material such as, for example, TEOS is then deposited over the semi-insulating layer 210 to form a layer 230 having a relatively planar exposed surface. The layers 230 and 210 are then etched back using a conventional etching technique which etches the material of the layer 230 at the same rate as the material of the layer 210 to produce the structure shown in FIG. 2 but without the metallisation layers 120 and 16. Where the pn-n diode 1 is being manufactured, p conductivity type impurities are then introduced through the first major surface 10a to form the second region 12. As another possibility, the implantation may be carried out before etching the opening (s) 17. It will be appreciated that the mask pattern will be different depending upon whether the diode 1 or 1a or the MOSFET 1c is being formed because in the former case, as described above, a trench-like field relief region 20 is provided and in the latter case discrete field relief regions 20 are provided. Metallisation is then deposited in known manner to form the electrodes 15 and 16 to produce the diode shown in FIG. 1. Where the Schottky diode 1a shown in FIG. 2 is being produced, then, after etching back of the layers 230 and 210 to expose the surface 10a, the Schottky metal 120 is deposited on the surface 10b and the electrode metallisation 16 is provided on the surface 10a as shown in FIG. 2.

Where the vertical MOSFET shown in FIG. 3 is being manufactured, then after the layers 230 and 210 have been etched back to expose the major surface 10b as shown in FIG. 8, a gate oxide and conductive layers are formed in conventional manner on the surface 10b and then patterned to define the insulated gate structure 30, 31. Generally, when viewed in plan looking down on the surface 10b, the insulated gate structure 30, 31 will form a regular, for example a square or hexagonal, grid. Impurities for forming the body and source regions 33 and 32 are then introduced using the insulated gate structure 30, 31 as a mask so that the conduction channel areas 33a are aligned in known manner with the insulated gate structure G by the relative diffusion of the impurities to form the body and source regions 32 and 33. A dielectric layer is then deposited over the surface 10b and etched anisotropically to define the dielectric region 35 over the insulated gate structure 30, 31. A window (not shown) is then formed in an area of the dielectric region 35 to expose a part of the gate conductive layer and metallisation deposited and patterned to define the source electrode 15 and a separate gate electrode (not shown in FIG. 3) contacting the gate conductive layer. Metallisation is also deposited on the other major surface 10a to form the drain electrode 16.

Although not shown in FIG. 3, the surface area of each body region 32 may have an increased concentration of p conductivity type impurities and parts of the source cells SC may be masked from the introduction of the impurities for forming the source regions so that areas of p conductivity type reach the major surface 10b so as to enable the source metallisation 15 to short the source regions 33 to the body regions 32 in known manner so as to inhibit parasitic bipolar action.

Figure 9:
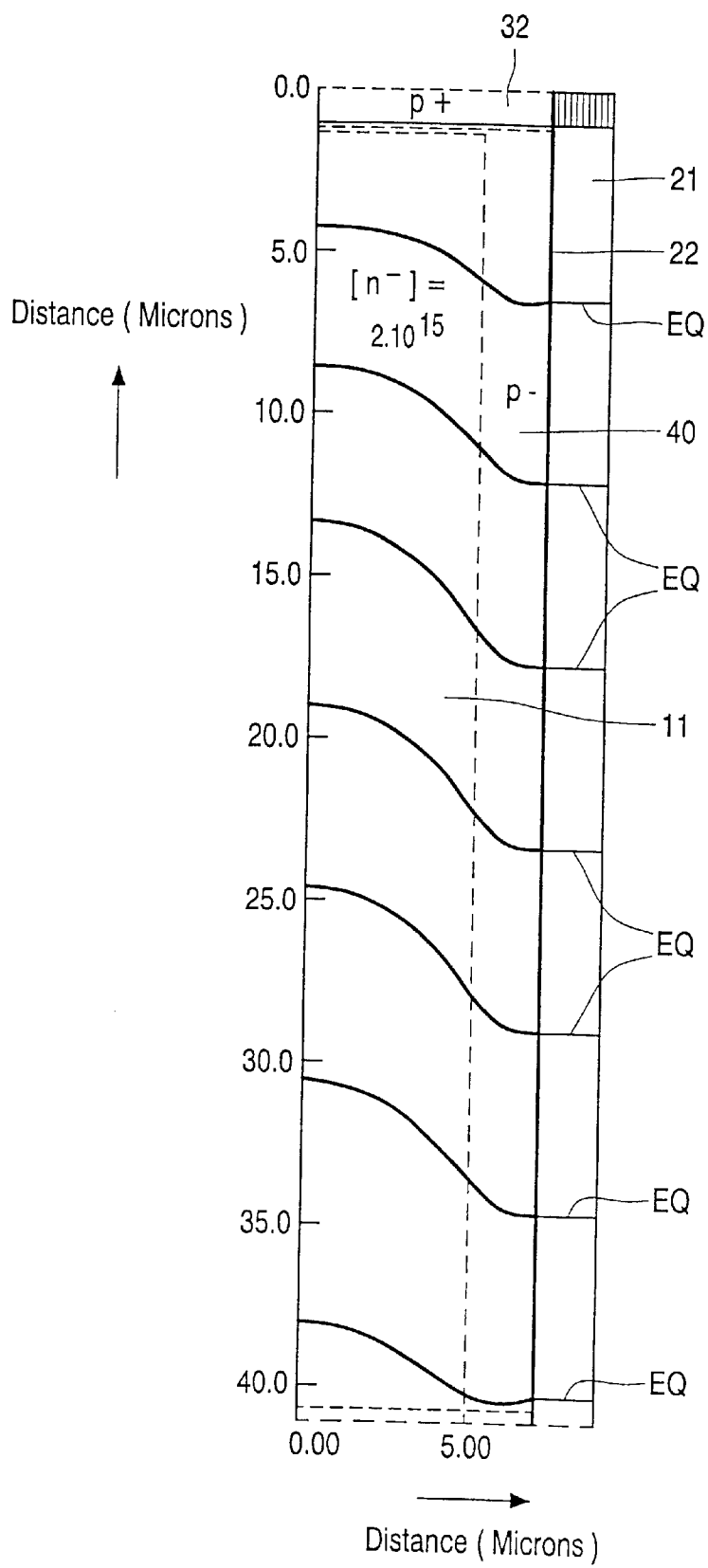
FIG. 9 shows a diagrammatic representation of part of a semiconductor device embodying the invention illustrating computer simulations of the electrical field within the voltage sustaining zone in a reverse-biased mode of operation when the device is non-conducting.

FIG. 9 shows a diagrammatic representation of part of the MOSFET shown in FIG. 3 for illustrating the results of computer simulations of the electric field within the voltage sustaining zone. In particular, FIG. 9 shows the equi-potential lines EQ within an area of the voltage sustaining zone consisting of half of a third region 11 and the adjoining fourth region 40, insulating layer 22 and resistive path 21 where the resistive path is formed of oxygen doped polycrystalline silicon, the insulating layer 22 is a 50 nm wide oxide layer, the fourth region 40 is of p-conductivity type having a width of 2 µm and the third region 11 is of n-conductivity type having a dopant concentration of $2 \times 10^{15}$ atoms cm$^{-3}$ and a half width of 5 µm. As can be seen from FIG. 9, the equi-potential lines EQ are evenly distributed to a depth of about 40 µm into the voltage sustaining zone when a reverse biasing voltage of 500 volts is applied between the main electrodes of the device.

Figure 10:
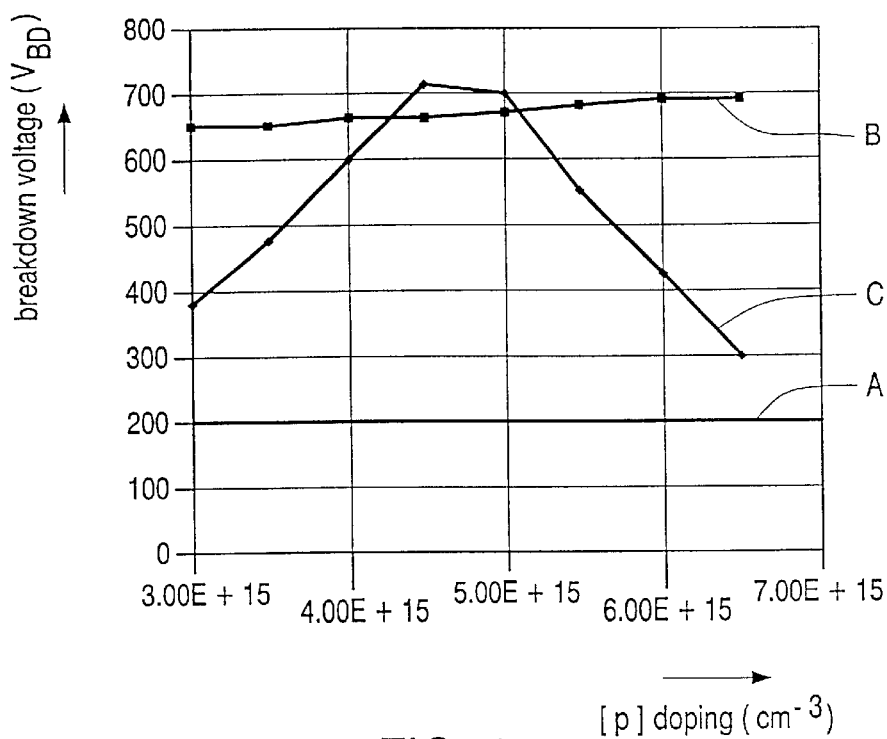
FIG. 10 shows a graph representing the results of computer simulations of breakdown voltage ($V_{BD}$) against doping of one of the opposite conductivity type interposed regions of a voltage sustaining zone.
Figure 11:
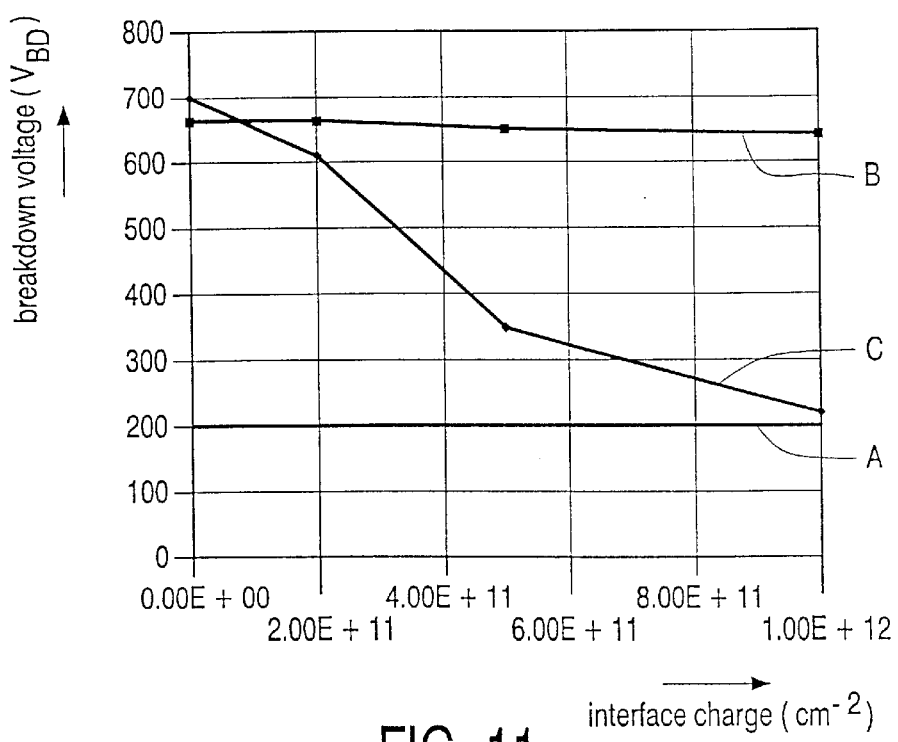
FIG. 11 shows a graph of computer simulations of breakdown voltage ($V_{BD}$) against interface charge.

FIGS. 10 and 11 show related computer simulations of the effect on the breakdown voltage ($V_{BD}$) of the dopant concentration in the fourth regions 40 and interface charge at the insulating layer 22. In both FIGS. 10 and 11, line A illustrates the silicon one dimensional limit, line B illustrates the results achieved when the resistive path 21 is present and line C illustrates the results achieved where the resistive path 21 is replaced by an insulating layer. In FIGS. 10 and 11 the notation "E+x" means "$0.10^{x}$" so that, for example, 4.00 E+15 means "$4 \times 10^{15}$".

As can be seen from FIGS. 10 and 11, when the resistive paths 21 are omitted (that is line C), the breakdown voltage varies markedly with both dopant concentration and interface charge with the breakdown voltage reaching a peak value of about 700 volts for a dopant concentration just below $5.10^{15}$ atoms cm$^{-3}$ and decreasing rapidly thereafter. As can be seen from FIG. 11, the breakdown voltage decreases rapidly with increasing interface charge in the case of line C, that is when the resistive paths 21 are omitted. In contrast, when the resistive paths 21 are provided (lines B in FIGS. 10 and 11), then the breakdown voltage is substantially insensitive to changes in dopant concentration and interface charge over the ranges shown.

In the embodiments described above, the resistive paths 21 are separated from the regions 40 by the insulating layers 22. The thickness of the insulating layers 22 is determined by the required ruggedness and speed of the device and therefore depends upon the magnitude of the electric field within the device during switching transients. Typically the insulating layer 22 may have a thickness of 30 nm. The insulating layer 22 serves to achieve a linear potential drop or difference along the resistive paths 21 because it inhibits or at least reduces the possibility of conduction between the resistive paths 21 and the regions 40. However, the resistive paths 21 will still serve to compensate for any imbalance in the space charge per unit area of the interposed regions 11 and 40 even in the absence of the insulating layers 21 and, although the electrical potential along the resistive paths will be less linear without the insulating layers 22, the effects of the present invention may be achieved without the insulating layers especially where the semi-insulating material is oxygen doped polycrystalline silicon (SIPOS).

The filler material 23 is provided to enable a substantially planar surface to be provided onto which the subsequent metallisation 15 can be deposited. Where such a planar surface is not essential, then it may be possible to omit the filler material. Also, the semiconductor devices 1, 1a and 1b could be designed so that the relative dimensions of the openings 17 and the thicknesses of the resistive paths 21 are such that the material of the resistive paths 21 substantially fills the openings 17 so that there is no need for any filler material. Having a wider opening 17 facilitates deposition of material into the opening whereas having a narrower opening 17 means that a filler material may not be necessary and it should be possible to achieve a lower on resistance because there will be a wider path through the n– first region 11.

In the embodiments described above, it is assumed that the thickness of the insulating layers 22 and the resistive paths 21 is constant in the direction from the second region to the third regions and that the resistivity of the resistive paths is constant in that direction.

In the above described embodiments it is also assumed that the dopant concentration of the interposed regions 11 and 14 is constant throughout the thickness of the semiconductor 10, however, the dopant concentration of one or other of the interposed regions 11 and 14 may be adjusted so as to vary through the thickness of the semiconductor body so that, for example, the dopant concentration of the first regions 11 increases toward the substrate region 14.

The present invention may be applied to other forms of semiconductor devices incorporating a rectifying (for example pn or Schottky) junction. For example, the present invention may be applied to a vertical MOSFET where the source regions are Schottky contact regions rather than semiconductor regions. The present invention may also be applied to depletion mode or normally on MOSFETs where the conduction channel areas 33 are doped so that the conduction channel is present until a voltage is applied to the gate electrode that is sufficient to remove the conduction channels. Where the substrate 14 shown in FIG. 3 will be of the opposite conductivity type (p conductivity type in the example shown) to the epitaxial layer 110.

It will, of course, be appreciated that the present invention may also be applied where the conductivity types given above are reversed and that semiconductor materials other than silicon may be used such as germanium or germanium silicon alloys.

In the above described examples, the resistive paths are provided by a semi-insulating material such as oxygen doped polycrystalline silicon or silicon nitride. However other materials providing resistivities similar to those given above may be used with the actual resistivity being selected to enable the desired leakage current, switching and ruggedness characteristics to be achieved.

In the MOSFET shown in FIG. 3, the insulated gate structure 30, 31 is provided on the second major surface. However, the present invention may also be applied to a so-called TRENCHFET where the insulated gate structure is formed within a trench extending into the semiconductor body from the second major surface 10b.

In the embodiments shown in FIGS. 1 to 3, each of the interposed third and fourth regions extends entirely through the voltage sustaining zone. This need, however, not be the case and the interposed third and fourth regions may adopt any shape and configuration provided that the third regions 11 provide a conduction path between the regions 14 and 12. For example, the regions 40 need not extend completely through the region 11 and may, for example, be provided as individual discrete regions dotted throughout the epitaxial layer 110.

From reading the present disclosure, other variations and modifications will be apparent to persons skilled in the art. Such variations and modifications may involve equivalent and other features which are already known in the design, manufacture and use of semiconductor devices, and which may be used instead of or in addition to features already described herein. Although claims have been formulated in this application to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention. The applicants hereby give notice that new claims may be formulated to any such features and/or combinations of such features during the prosecution of the present application or of any further application derived therefrom.

What is claimed is:

1. A semiconductor device comprising a semiconductor body having first and second opposed major surfaces, a first region meeting the first major surface and at least one second region meeting the second major surface, the semiconductor body providing a voltage-sustaining zone between the first and second regions, the voltage sustaining zone having third regions of one conductivity type interposed with fourth regions of the opposite conductivity type with the second and third regions providing a rectifying junction such that, in use, when the rectifying junction is forward-biased in one mode of operation by a voltage applied between the first and second regions, a main current path is provided between the first and second major surfaces through the first region, the voltage-sustaining zone and the second region, the dimensions and dopant concentrations of the third and fourth regions being such that, when the rectifying junction is reverse-biased in another mode of operation by a voltage applied between the first and second regions the interposed third and fourth regions are depleted of free charge carriers and the space charge per unit area of the third and fourth regions substantially balance, characterised in that a plurality of field shaping regions are dispersed in parallel-walled trenches within the voltage sustaining zone, each field shaping region extending into said first region, being electrically conductively connected to both said first region and said second region, and providing a resistive path extending from the rectifying junction into the first region such that, in said other mode of operation, a leakage current flows along the resistive paths to modify the electric field gradient within the voltage-sustaining zone.

2. A device according to claim 1, wherein each field shaping region extends completely through the voltage-sustaining zone to the first region.

3. A device according to claim 1, wherein the field shaping regions comprise semi-insulating layers provided on surfaces of openings extending into the semiconductor body from the second major surface.

4. A device according to claim 3, wherein each opening is filled by a filler material provided on the semi-insulating layer.

5. A device according to claim 3, wherein each semi-insulating layer is separated from the remainder of the voltage sustaining zone by an insulating region.

6. A device according to claim 1, wherein the resistive paths comprise at least one of oxygen doped polycrystalline silicon and silicon nitride.

7. A device according to claim 1, wherein the first region is a semiconductor region of the same conductivity type but more highly doped than the third regions.

8. A device according to claim 1, wherein the second region is a semiconductor region of the opposite conductivity type to the third regions such that the rectifying junction is a pn rectifying junction.

9. A device according to claim 1, wherein the second region is a Schottky region such that the rectifying junction is a Schottky junction.

10. A device according to claim 1, wherein the at least one second region contains a source region and the device further comprises an insulated gate structure for controlling a conduction channel area of the second region to control conduction between the source region and the voltage-sustaining zone.

11. A device according to claim 10, wherein a plurality of second regions are provided each containing a source region and each second region is associated with a respective different field shaping region.

12. A semiconductor device according to claim 1, wherein the resistive paths are separate discrete resistive paths.

13. A semiconductor device according to claim 1, wherein the resistive paths form a grid or network within the voltage sustaining zone.

14. A semiconductor device according to claim 1, wherein the resistive paths are formed as a continuous resistive region within a grid or mesh-like trench formed within the voltage sustaining zone.

15. A semiconductor device according to claim 1, wherein the resistive paths are coupled to a main electrode of the device, which main electrode is coupled to the second region or a region within the second region.

* * * * *